US012753491B2

(12) United States Patent
Hasegawa et al.

(10) Patent No.: US 12,753,491 B2
(45) Date of Patent: Oct. 6, 2026

(54) FILLING METHOD AND FILM FORMING APPARATUS

(71) Applicant: Tokyo Electron Limited, Tokyo (JP)

(72) Inventors: Toshio Hasegawa, Nirasaki City (JP); Katsutoshi Ishii, Nirasaki City (JP)

(73) Assignee: Tokyo Electron Limited, Tokyo (JP)

( * ) Notice: Subject to any disclaimer, the term of this patent is extended or adjusted under 35 U.S.C. 154(b) by 96 days.

(21) Appl. No.: 18/247,497

(22) PCT Filed: Oct. 4, 2021

(86) PCT No.: PCT/JP2021/036643
§ 371 (c)(1),
(2) Date: Mar. 31, 2023

(87) PCT Pub. No.: WO2022/080169
PCT Pub. Date: Apr. 21, 2022

(65) Prior Publication Data
US 2023/0374656 A1 Nov. 23, 2023

(30) Foreign Application Priority Data
Oct. 12, 2020 (JP) ................................ 2020-172144

(51) Int. Cl.
*C23C 16/04* (2006.01)
*C23C 16/40* (2006.01)
*C23C 16/56* (2006.01)

(52) U.S. Cl.
CPC .......... *C23C 16/045* (2013.01); *C23C 16/403* (2013.01); *C23C 16/56* (2013.01)

(58) Field of Classification Search
None
See application file for complete search history.

(56) References Cited

U.S. PATENT DOCUMENTS 5,880,036 A * 3/1999 Becker .............. H01L 21/31116 438/743
2015/0228473 A1* 8/2015 Yabe ................ H01L 21/02178 118/725
2016/0172189 A1* 6/2016 Tapily .............. H01L 21/02296 438/778
2017/0140983 A1* 5/2017 Leschkies ......... H01L 21/02181
2018/0080124 A1* 3/2018 Bajaj ................ H01J 37/32449
2020/0095674 A1* 3/2020 Saly .................... C23C 16/4584
2020/0251346 A1* 8/2020 Guo .................. H01L 21/31116
2021/0193486 A1* 6/2021 Li .......................... C23C 16/40
(Continued)

FOREIGN PATENT DOCUMENTS

JP 2005-175466 A 6/2005
JP 2015-019075 A 1/2015
(Continued)

*Primary Examiner* — Jose I Hernandez-Kenney
(74) *Attorney, Agent, or Firm* — Armstrong Teasdale LLP

(57) ABSTRACT

A filling method according to one aspect of the present disclosure is a method of filling a recess formed in a surface of a substrate with a metal oxide film. The method includes forming the metal oxide film by supplying a metallic raw material gas and an oxidant to the recess, and etching a part of the metal oxide film by supplying an etching gas including at least one selected from a group including $SOCl_2$ and $(COCl)_2$ to the metal oxide film.

12 Claims, 4 Drawing Sheets

(56) References Cited

U.S. PATENT DOCUMENTS

| | | | | |
|---|---|---|---|---|
| 2021/0308726 | A1* | 10/2021 | Singhal | B08B 3/08 |
| 2022/0389580 | A1* | 12/2022 | Chen | C23C 16/45542 |

FOREIGN PATENT DOCUMENTS

| | | | |
|---|---|---|---|
| JP | 2015-149461 | A | 8/2015 |
| JP | 2016-141882 | A | 8/2016 |
| JP | 2019-501518 | A | 1/2019 |
| JP | 2020-501373 | A | 1/2020 |
| JP | 2020-059916 | A | 4/2020 |
| KR | 10-2015-0094513 | A | 8/2015 |
| KR | 10-2018-0069038 | A | 6/2018 |
| KR | 10-2020-0038854 | A | 4/2020 |
| WO | 2017-030150 | A1 | 2/2017 |
| WO | 2020-050124 | A1 | 3/2020 |

* cited by examiner

FILLING METHOD AND FILM FORMING APPARATUS

CROSS-REFERENCE TO RELATED APPLICATIONS

The present application is a U.S. National Stage Entry of International Patent Application No. PCT/JP2021/036643, filed Oct. 4, 2021, which claims the benefit of priority to Japanese Patent Application No. 2020-172144, filed Oct. 12, 2020, each of which is hereby incorporated herein by reference in its entirety.

TECHNICAL FIELD

The present disclosure relates to a filling method and a film forming apparatus.

BACKGROUND

A technique for forming an aluminum-containing oxide thin film by atomic layer deposition using, as a raw material, an aluminum-containing composition containing trimethylaluminum and dimethylaluminum hydride and an oxygen-containing compound containing oxygen atoms is known (see Patent Document 1, for example). Further, a technique for removing the $Al_2O_3$ film from the reactor surface by reacting an $Al_2O_3$ film coated over a surface of a reactor with $BCl_3$ and $COCl_2$ to produce a volatile product and by removing the volatile product from the reactor, is known (see Patent Document 2, for example).

PRIOR ART DOCUMENTS

Patent Documents

Patent 1: Japanese Patent Laid-Open Publication No. 2016-141882

Patent 2: Japanese Patent Laid-Open Publication No. 2005-175466

The present disclosure provides a technique capable of forming a high-quality metal oxide film with good filling characteristics.

SUMMARY

A filling method according to one aspect of the present disclosure is a method of filling a recess formed in a surface of a substrate with a metal oxide film, the method including forming the metal oxide film by supplying a metallic raw material gas and an oxidant to the recess, and etching a part of the metal oxide film by supplying an etching gas including at least one selected from a group including $SOCl_2$ and $(COCl)_2$ to the metal oxide film.

According to the present disclosure, it is possible to form a high-quality metal oxide film with good filling characteristics.

DETAILED DESCRIPTION

Figure 1A:
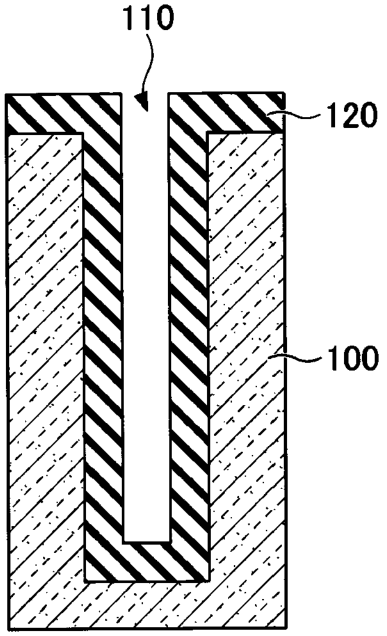
FIG. 1A is a cross-sectional view of a process illustrating an example of a filling method according to an embodiment.

Hereinafter, non-limiting exemplary embodiments of the present disclosure will be described with reference to the accompanying drawings. In all the accompanying drawings, the same or corresponding members or components will be denoted by the same or corresponding reference numerals, and redundant descriptions thereof will be omitted.

(Metal Oxide Film)

There is a need to fill a recess with a high-quality metal oxide film. The high-quality metal oxide film is formed by a high-temperature process at, for example, 500 degrees C. or higher. However, the high-temperature process tends to deteriorate a step coverage to the recess, and degrades filling characteristics.

Therefore, the present inventors have extensively studied a method of forming a high-quality metal oxide film with good filling characteristics. As a result, it was found that a high-quality metal oxide film having good filling characteristics can be formed by a filling method including a process of forming a metal oxide film and a process of etching a part of the metal oxide film by thionyl chloride [$SOCl_2$] and/or oxalyl chloride [$(COCl)_2$]. Details will be described below.

(Filling Method)

An example of a filling method of an embodiment will be described with reference to FIGS. 1A to 1C. The filling method of the embodiment is a method of filling a recess formed in a surface of a substrate with an aluminum oxide film ($Al_2O_3$ film) by repeating a cycle including a film forming process and an etching process.

In the film forming process, as illustrated in FIG. 1A, an $Al_2O_3$ film 120 is formed by supplying an Al raw material gas and an oxidant to a recess 110 formed in a surface of a substrate 100. The substrate 100 may be, for example, a wafer such as a silicon wafer. The recess 110 may be, for example, a trench or a via. For example, the film forming process forms the $Al_2O_3$ film 120 so as not to block an opening of the recess 110. In the film forming process, the $Al_2O_3$ film 120 may be formed by atomic layer deposition (ALD). That is, in the film forming process, the $Al_2O_3$ film 120 is preferably formed in the recess 110 by repeating the supply of the Al raw material gas, the supply of a purge gas, the supply of the oxidant, and the supply of the purge gas in this order. Thus, the $Al_2O_3$ film 120 may be formed conformally in the recess 110, so that voids, seams, and the like are less likely to occur when the $Al_2O_3$ film 120 is filled in the recess 110. Further, in the film forming process, the substrate may be heated to a high temperature of 500 degrees C. or higher. Thus, the high-quality $Al_2O_3$ film 120 may be formed. In film formation by ALD which is performed while the substrate is heated to a temperature of 500 degrees C. or higher, for example, a halogen-containing Al raw material gas such as $AlCl_3$, $(CH_3)_3Al_2Cl_3$, EADC[$(CH_3CH_2)AlCl_2$], DEAC[$(CH_3CH_2)_2AlCl$], EASC[$(CH_3CH_2)_{1.5}AlCl_{1.5}$], DMAC[$(CH_3)_2AlCl$] may be used as the Al raw material gas. For example, $O_2$ gas, $O_3$ gas), $H_2O$ gas, $H_2O_2$ gas, a mixed gas of $H_2$ and $O_2$, isopropyl alcohol (IPA) gas may be used as the oxidant. An inert gas such as $N_2$ gas or Ar gas may be used as the purge gas.

For example, when DMAC[$(CH_3)_2AlCl$] is used as the Al raw material gas and the $H_2O$ gas is used as an oxidizing gas, the $Al_2O_3$ film 120 is formed by a chemical reaction represented by the following formula (A).

$$(CH_3)_2AlCl+H_2O \rightarrow Al_2O_3(s)+CH_4(g)+HCl(g) \quad \text{(A)}$$

Figure 1B:
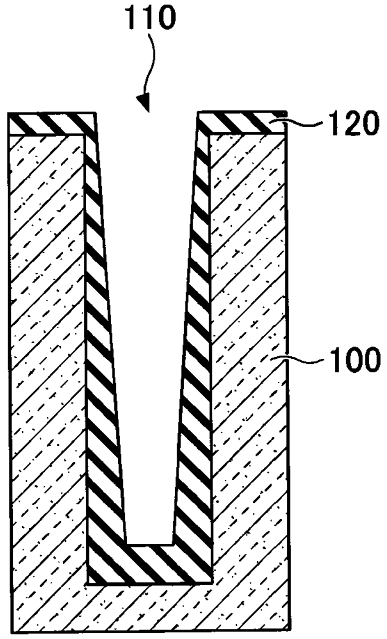
FIG. 1B is a cross-sectional view of a process illustrating the example of the filling method according to the embodiment.

In the etching process, as illustrated in FIG. 1B, a part of the $Al_2O_3$ film 120 is etched by supplying an etching gas including at least one selected from a group including thionyl chloride [$SOCl_2$] and oxalyl chloride [$(COCl)_2$] to the $Al_2O_3$ film 120. For example, in the etching process, the $Al_2O_3$ film 120 is selectively etched so as to widen the opening of the recess 110. In the etching process, the substrate may be heated to the same temperature as or substantially the same temperature as the temperature in the film forming process, for example, to a high temperature of 500 degrees C. or higher. The substantially same temperature means a temperature within a range of ±5% with respect to the same temperature. $SOCl_2$ and $(COCl)_2$ have an etching rate of 1 nm/min to 100 nm/min for the $Al_2O_3$ film 120 at a temperature of 500 degrees C. or higher. Therefore, by using $SOCl_2$ and $(COCl)_2$ as the etching gas, a part of the $Al_2O_3$ film 120 may be etched with good controllability without changing the processing temperatures of the film forming process and the etching process. In this way, in the etching process, the etching gas having an etching rate of 1 nm/min and 100 nm/min for the $Al_2O_3$ film 120 at a temperature of 500 degrees C. or higher is preferably used. Further, more preferably, the etching gas having an etching rate of 5 nm/min to 50 nm/min is used. Further, $SOCl_2$ and $(COCl)_2$ have a low etching rate for the $Al_2O_3$ film 120 at a temperature less than 500 degrees C. Therefore, the film deposited on an inner wall of a processing container, which has a lower temperature than the substrate, is hardly etched, so that generation of particles due to peeling of the deposited film from the inner wall of the processing container can be prevented. For example, when a $SOCl_2$ gas is used as the etching gas, a part of the $Al_2O_3$ film 120 may be etched by a chemical reaction represented by the following formula (B).

$$Al_2O_3+SOCl_2 \rightarrow AlCl_3(g)+SO_2(g) \quad \text{(B)}$$

Figure 1C:
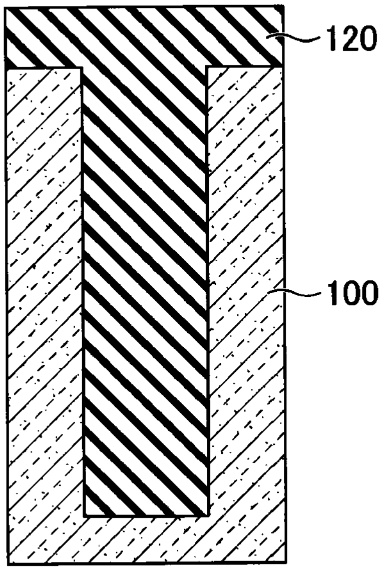
FIG. 1C is a cross-sectional view of a process illustrating the example of the filling method according to the embodiment.

According to the filling method of the embodiment described above, by repeating a cycle including the film forming process and the etching process, as illustrated in FIG. 1C, the $Al_2O_3$ film 120 is filled in the recess 110 on the recess 110 formed in the surface of the substrate 100. Then, in the etching process, the etching gas including at least one selected from a group including $SOCl_2$ and $(COCl)_2$ is supplied to the $Al_2O_3$ film 120 to etch a part of the $Al_2O_3$ film. Thus, a high-quality metal oxide film with good filling characteristics can be formed.

In the above, a case where the $Al_2O_3$ film 120 is filled in the recess 110 only having a vertical holes has been described with reference to FIGS. 1A to 1C, but the present disclosure is not limited thereto. For example, as illustrated in FIGS. 2A to 2C, a filling method of the embodiment may also be applied to a case where a recess 210 formed in a surface of a substrate 200 includes a vertical hole 211 extending in the thickness direction of the substrate 200 and a horizontal hole 212 extending in a direction parallel to the surface of the substrate 200 from a sidewall 211*a* of the vertical hole 211.

Figure 2A:
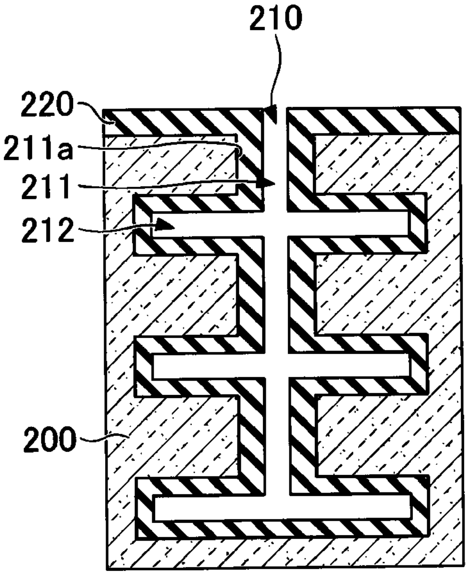
FIG. 2A is a cross-sectional view of a process illustrating another example of a filling method according to an embodiment.
Figure 2B:
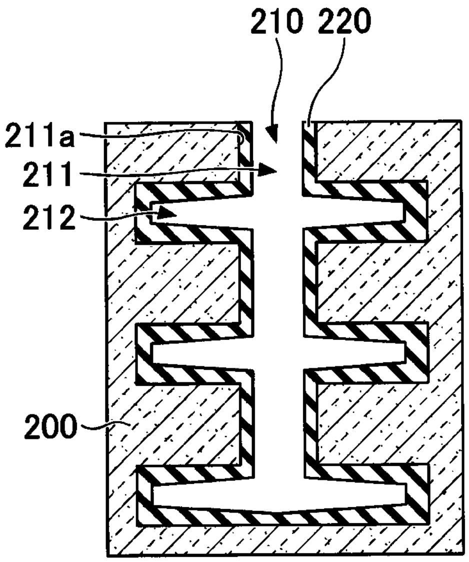
FIG. 2B is a cross-sectional view of a process illustrating another example of the filling method according to the embodiment.
Figure 2C:
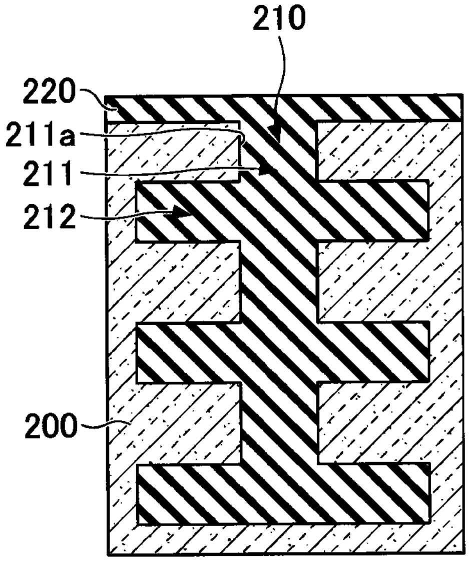
FIG. 2C is a cross-sectional view of a process illustrating another example of the filling method according to the embodiment.

Specifically, in the film forming process, as illustrated in FIG. 2A, an $Al_2O_3$ film 220 is formed by supplying an Al raw material gas and an oxidant to the recess 210 formed in the surface of the substrate 200. In the etching process, as illustrated in FIG. 2B, a part of the $Al_2O_3$ film 220 is etched by supplying an etching gas including at least one selected from a group including thionyl chloride [$SOCl_2$] and oxalyl chloride [$(COCl)_2$] to the $Al_2O_3$ film 220. Then, by repeating a cycle including the film forming process and the etching process, as illustrated in FIG. 2C, the $Al_2O_3$ film 220 can be filled in the recess 210.

(Film Forming Apparatus)

Figure 3:
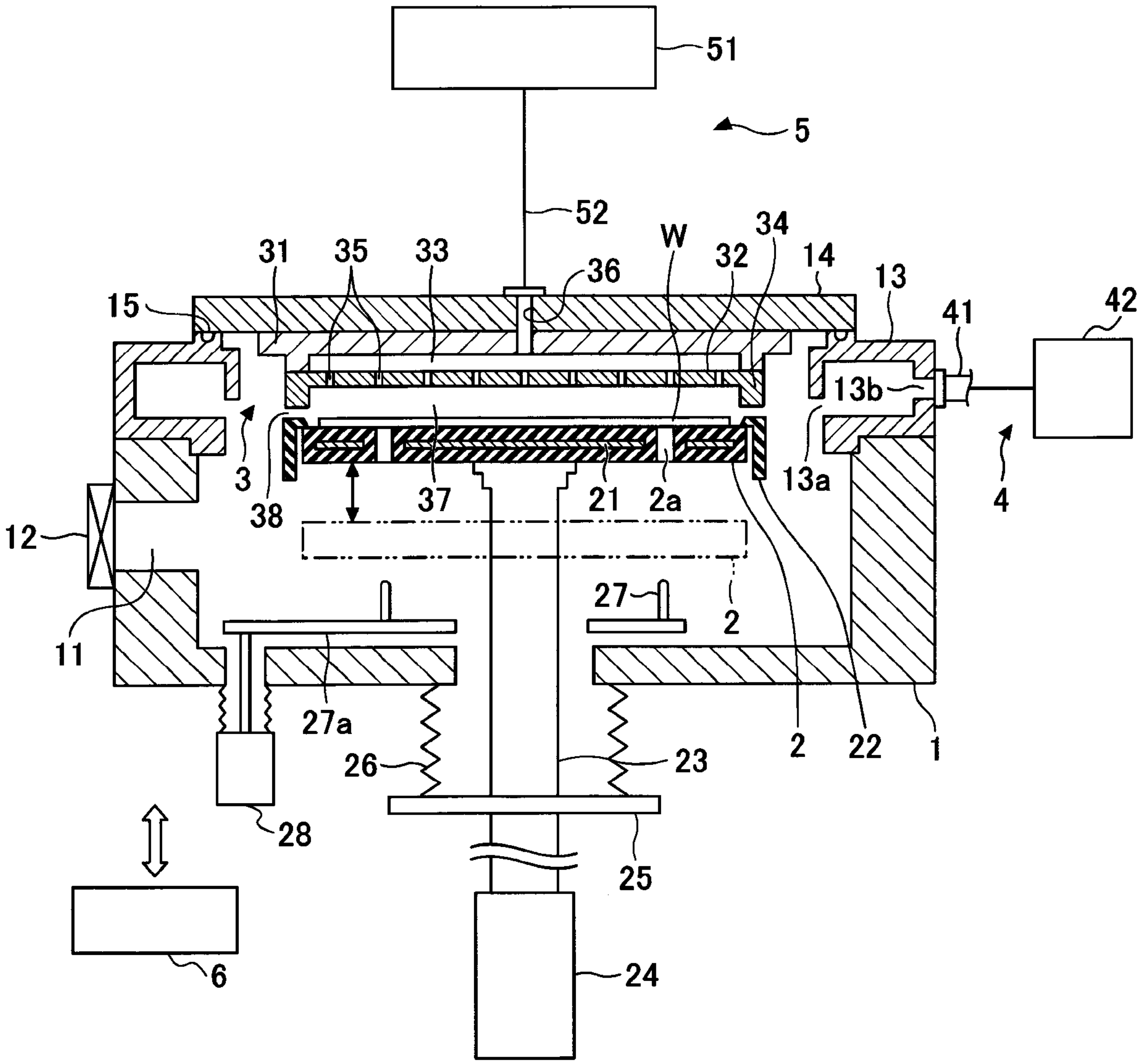
FIG. 3 is a schematic cross-sectional view illustrating an example of a film forming apparatus for performing the filling method according to an embodiment.

An example of a film forming apparatus for performing the filling method of the embodiment will be described with reference to FIG. 3. The film forming apparatus of the embodiment is configured as an apparatus capable of performing film formation by an atomic layer deposition (ALD) method and film formation by a chemical vapor deposition (CVD) method.

The film forming apparatus includes a processing container 1, a stage 2, a shower head 3, an exhauster 4, a gas supplier 5, a controller 6, and the like.

The processing container 1 is formed of a metal such as aluminum and has a substantially cylindrical shape. The processing container 1 accommodates a substrate W therein. The substrate W may be, for example, a semiconductor wafer. A loading/unloading port 11 for loading or unloading substrate W is formed in a sidewall of the processing container 1. The loading/unloading port 11 is opened and closed by a gate valve 12. An annular exhaust duct 13 having a rectangular cross section is provided on a main body of the processing container 1. A slit 13*a* is formed in the exhaust duct 13 along an inner peripheral surface thereof. An exhaust port 13*b* is formed in an outer wall of the exhaust duct 13. A ceiling wall 14 is provided on an upper surface of the exhaust duct 13 so as to close an upper opening of the processing container 1. A space between the exhaust duct 13 and the ceiling wall 14 is airtightly sealed with a seal ring 15.

The stage 2 horizontally supports the substrate W inside the processing container 1. The stage 2 takes the form of a disk larger than the substrate W, and is formed of a ceramic material such as an aluminum nitride (AlN) or a metallic material such as an aluminum or nickel alloy. A heater 21 for heating the substrate W is embedded inside the stage 2. The heater 21 generates heat upon receiving power from a heater power supply (not illustrated). Then, the substrate W is controlled to a predetermined temperature by controlling the output of the heater 21 in response to a temperature signal of a thermocouple (not illustrated) provided near an upper surface of the stage 2. A cover member 22 formed of ceramics such as alumina is provided on the stage 2 so as to cover an outer peripheral region of the upper surface and a side surface of the stage 2.

The stage 2 is supported by a support member 23. The support member 23 passes through a hole formed in a bottom wall of the processing container 1 from the center of a bottom surface of the stage 2 to extend downward of the processing container 1, and is connected at a lower end thereof to a lifting mechanism 24. The stage 2 is lifted by the lifting mechanism 24 between a processing position illustrated in FIG. 3 and a transfer position thereunder where the substrate W may be transferred as illustrated by the two-dotted dash line. A flange 25 is attached to the support member 23 at a position below the processing container 1. A bellows 26 is provided between a bottom surface of the processing container 1 and the flange 25. The bellows 26 separates the atmosphere inside the processing container 1 from outside air, and is adapted to expand and contract according to a lifting operation of the stage 2.

Three (only two of which are illustrated) wafer support pins 27 are provided near the bottom surface of the processing container 1 so as to protrude upward from a lifting plate 27*a*. The wafer support pins 27 are lifted by a lifting mechanism 28 provided below the processing container 1 via a lifting plate 27*a*. The wafer support pins 27 are inserted into through-holes 2*a* provided in the stage 2 which is at the transfer position, and are capable of protruding and retracting to and from the upper surface of the stage 2. The wafer W is transferred between a transfer robot (not illustrated) and the stage 2 by lifting/lowering the wafer support pins 27.

The shower head 3 supplies a processing gas in the form of a shower into the processing container 1. The shower head 3 is formed of, for example, a metallic material, and is arranged to face the stage 2. The shower head 3 has substantially the same diameter as the stage 2. The shower head 3 includes a main body 31 and a shower plate 32. The main body 31 is fixed to a lower surface of the ceiling wall 14. The shower plate 32 is connected below the main body 31. A gas diffusion space 33 is defined between the main body 31 and the shower plate 32. A gas introduction hole 36 is provided in the gas diffusion space 33 so as to penetrate the center of the ceiling wall 14 and the main body 31. An annular protrusion 34 is formed on a peripheral edge portion of the shower plate 32 to protrude downward. A plurality of gas discharge holes 35 is formed in an inner flat surface of the annular protrusion 34 of the shower plate 32.

In a state where the stage 2 is moved to the processing position, a processing space 37 is created between the stage 2 and the shower plate 32, and an upper surface of the cover member 22 and the annular protrusion 34 become closer to each other to create an annular gap 38.

The exhauster 4 exhausts the interior of the processing container 1. The exhauster 4 includes an exhaust pipe 41 and an exhaust mechanism 42. The exhaust pipe 41 is connected to the exhaust port 13*b*. The exhaust mechanism 42 is connected to the exhaust pipe 41, and includes a vacuum pump, a pressure control valve, and the like. The exhaust mechanism 42 exhausts the gas inside the processing container 1 through the exhaust duct 13 and the exhaust pipe 41.

The gas supplier 5 supplies various gases to the shower head 3. The gas supplier 5 includes a gas source 51 and a gas line 52. The gas source 51 includes, for example, a source for various processing gases, a mass flow controller, and a valve (none of which are illustrated). The various processing gases include the Al raw material gas, the oxidant, and the etching gas used in the filling method of the above-described embodiment. These various gases are introduced into the gas diffusion space 33 from the gas source 51 through the gas line 52 and the gas introduction hole 36.

The controller 6 controls each part of the film forming apparatus, thereby performing, for example, the above-described filling method. The controller 6 may be, for example, a computer. Further, a program of a computer that operates each part of the film forming apparatus is stored in a storage medium. The storage medium may be, for example, a flexible disk, a compact disk, a hard disk, a flash memory, a DVD, or the like.

Next, a case of performing the filling method of the embodiment illustrated in FIGS. 1A to 1C and 2A to 2C will be described as an example of an operation of the film forming apparatus.

First, the controller 6 opens the gate valve 12, transfers the substrate W having a recess in a surface thereof into the processing container 1 by the transfer mechanism (not illustrated), and places the substrate W on the stage 2. The substrate W is placed horizontally with the surface facing upward. The controller 6 closes the gate valve 12 after retracting the transfer mechanism from the interior of the processing container 1. Next, the controller 6 heats the substrate W to a predetermined temperature by the heater 21 of the stage 2, and adjusts the interior of the processing container 1 to a predetermined pressure by the exhaust mechanism 42.

Next, the controller 6 controls each part of the film forming apparatus to perform the filling method of the above-described embodiment. That is, the controller 6 controls the exhauster 4, the gas supplier 5, and the like to repeat a cycle including the film forming process and the etching process, thereby filling the recess with the $Al_2O_3$ film.

After the $Al_2O_3$ film is filled in the recess formed in the surface of the substrate W, the controller 6 unloads the substrate W from the processing container 1 in the reverse order of loading the substrate W into the processing container 1.

In addition, in the above embodiment, the Al raw material gas is an example of a metallic raw material gas, and the $Al_2O_3$ film is an example of a metal oxide film.

The embodiments disclosed herein should be considered to be exemplary and not limitative in all respects. The above embodiments may be omitted, replaced or modified in various embodiments without departing from the scope of the appended claims and their gist.

In the above embodiment, a case of forming the $Al_2O_3$ film as the metal oxide film has been described, but the present disclosure is not limited thereto. For example, the metal oxide film may be a high-k film such as $HfO_2$ film or $ZrO_2$ film. For example, in a case of forming the $HfO_2$ film, for example, $HfCl_4$ may be used as the metallic raw material gas. Further, for example, in a case of forming the $ZrO_2$ film, a $ZrCl_4$ gas may be used as the metallic raw material gas. $SOCl_2$ and $(COCl)_2$ have an etching rate of 1 nm/min to 100 nm/min for the $HfO_2$ film and the $ZrO_2$ film at a temperature of 500 degrees C. or higher. Therefore, by using $SOCl_2$ and $(COCl)_2$ as the etching gas, a part of the $HfO_2$ film and the $ZrO_2$ film may be etched with good controllability without changing the processing temperatures of the film forming process and the etching process, as in the case of the $Al_2O_3$ film.

In the above embodiments, a case of using thionyl chloride [$SOCl_2$] and oxalyl chloride [$(COCl)_2$] as the etching gas has been described, but the present disclosure is not limited thereto. For example, a $Cl_2$ gas, a $BCl_3$ gas, or a $ClF_3$ gas may be used as the etching gas.

In the above embodiments, a case where the film forming apparatus is a single wafer type apparatus that processes substrates one by one has been described, but the present disclosure is not limited thereto. For example, the film forming apparatus may be a batch type apparatus that processes on a plurality of substrates at once. Further, for example, the film forming apparatus may be a semi-batch type apparatus that revolves a plurality of substrates disposed on a rotation table inside a processing container by the rotation table, thereby sequentially passing the substrates through a region to which a first gas is supplied and a region to which a second gas is supplied to perform a processing on the substrates.

In the above embodiment, a case where the film forming apparatus is an apparatus having no plasma generator has been described, but the present disclosure is not limited thereto. For example, the film forming apparatus may be an apparatus having a plasma generator.

This international application claims priority to Japanese Patent Application No. 2020-172144 filed on Oct. 12, 2020, which is incorporated herein by reference in its entirety.

EXPLANATION OF REFERENCE NUMERALS

1: processing container, 5: gas supplier, 6: controller

What is claimed is:

1. A method of filling a recess formed in a surface of a substrate with a metal oxide film, the method comprising:

loading the substrate into a processing container;

forming the metal oxide film by supplying a metallic raw material gas and an oxidant to the recess; and etching a part of the metal oxide film by supplying an etching gas including at least one selected from a group of $SOCl_2$ and $(COCl)_2$ to the metal oxide film, wherein, in the forming and the etching, the substrate is heated to 500 degrees C. or higher, wherein the metal oxide film is at least one selected from a group of aluminum oxide film, hafnium oxide film, and zirconium oxide film, and wherein, in the etching, the metal oxide film formed on the recess is selectively etched with respect to the metal oxide film formed on an inner wall of the processing container.

2. The method of claim 1, wherein the forming and the etching are performed at a same temperature or a substantially same temperature.

3. The method of claim 2, wherein the forming and the etching are repeated.

4. The method of claim 3, wherein, in the forming, the metal oxide film is formed by atomic layer deposition.

5. The method of claim 4, wherein the recess includes a vertical hole extending in a thickness direction of the substrate.

6. The method of claim 5, wherein the recess includes a horizontal hole extending in a direction parallel to the surface of the substrate from a sidewall of the vertical hole.

7. The method of claim 6, wherein the metallic raw material gas contains a metal and a halogen.

8. The method of claim 1, wherein the forming and the etching are repeated.

9. The method of claim 1, wherein, in the forming, the metal oxide film is formed by atomic layer deposition.

10. The method of claim 1, wherein the recess includes a vertical hole extending in a thickness direction of the substrate.

11. The method of claim 10, wherein the recess further includes a horizontal hole extending in a direction parallel to the surface of the substrate from a sidewall of the vertical hole.

12. The method of claim 1, wherein the metallic raw material gas contains a metal and a halogen.

* * * * *